(12) United States Patent
Sirringhaus et al.

(10) Patent No.: US 8,174,634 B2
(45) Date of Patent: May 8, 2012

(54) ALIGNMENT TOLERANT PATTERNING ON FLEXIBLE SUBSTRATES

(75) Inventors: Henning Sirringhaus, Cambridge (GB); Seamus Burns, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 944 days.

(21) Appl. No.: 11/720,425

(22) PCT Filed: Dec. 2, 2005

(86) PCT No.: PCT/GB2005/050231
§ 371 (c)(1),
(2), (4) Date: May 22, 2008

(87) PCT Pub. No.: WO2006/059162
PCT Pub. Date: Jun. 8, 2006

(65) Prior Publication Data
US 2008/0265244 A1    Oct. 30, 2008

(30) Foreign Application Priority Data

Dec. 3, 2004 (GB) .................................. 0426563.3
May 19, 2005 (GB) .................................. 0510173.8

(51) Int. Cl.
*G02F 1/136* (2006.01)
(52) U.S. Cl. ................. 349/43; 349/54; 257/40; 438/99
(58) Field of Classification Search ............ 257/40; 438/99; 349/43, 54
See application file for complete search history.

(56) References Cited

U.S. PATENT DOCUMENTS

| | | | | |
|---|---|---|---|---|
| 4,356,216 A | | 10/1982 | Gailey et al. | |
| 5,097,297 A | * | 3/1992 | Nakazawa | 257/347 |
| 5,327,001 A | * | 7/1994 | Wakai et al. | 257/350 |
| 5,414,283 A | * | 5/1995 | den Boer et al. | 257/59 |
| 5,656,824 A | * | 8/1997 | den Boer et al. | 257/59 |
| 5,737,041 A | * | 4/1998 | Holmberg et al. | 349/43 |
| 5,877,512 A | | 3/1999 | Kim | |

(Continued)

FOREIGN PATENT DOCUMENTS

EP     0276340 A    8/1988

(Continued)

OTHER PUBLICATIONS

Rogers J.A. et al., "*Printed Plastic Electronics and Paperlike Displays*", Highlight, Journal of Polymer Science: Part A: Polymer Chemistry, vol. 40, Wiley Periodicals, Inc. 2002, pp. 3327-3334.

(Continued)

*Primary Examiner* — Anthony Ho
(74) *Attorney, Agent, or Firm* — Knobbe, Martens Olson & Bear LLP

(57) ABSTRACT

A method is provided for fabricating a multilayer electronic device on a flexible substrate including at least a first and a second patterned layer, wherein the first patterned layer is defined with a linewidth that is smaller than the linewidth of the second patterned layer, and the second patterned layer is defined by a patterning technique which is capable of correcting for local distortions of the pattern of said first layer on top of the flexible substrate and wherein the first patterned layer is laid-out in such a way that the geometric overlap between a portion of the second layer and a portion of the first layer is insensitive against small variations of the position of the second patterned layer.

15 Claims, 13 Drawing Sheets

U.S. PATENT DOCUMENTS

| | | | |
|---|---|---|---|
| 6,274,884 B1 * | 8/2001 | Lee et al. | 257/57 |
| 6,831,710 B2 * | 12/2004 | den Boer | 349/48 |
| 6,924,854 B2 * | 8/2005 | Chung | 349/43 |
| 7,387,905 B2 * | 6/2008 | Kim | 438/30 |
| 7,605,799 B2 * | 10/2009 | Amundson et al. | 345/107 |
| 2002/0132398 A1 | 9/2002 | Deane et al. | |
| 2003/0148560 A9 | 8/2003 | Deane et al. | |
| 2004/0235227 A1 | 11/2004 | Kawase | |

FOREIGN PATENT DOCUMENTS

| | | |
|---|---|---|
| EP | 0333151 A | 9/1989 |
| WO | WO 01/20691 | 3/2001 |
| WO | WO 01/47043 | 6/2001 |

OTHER PUBLICATIONS

Jackson, T.N. et al., "*Organic Thin-Film Transistors for Organic Light-Emitting Flat-Panel Display Backplanes*", IEEE Journal of Selected Topics in Quantum Electronics, vol. 4, No. 1, Jan./Feb. 1998, pp. 100-104.

International Search Report for PCT/GB2005/050231, mailed on Apr. 5, 2006.

International Preliminary Report on Patentability and Written Opinion for International Application No. PCT/GB2005/050231 mailed Jun. 14, 2007.

* cited by examiner

Print direction

ALIGNMENT TOLERANT PATTERNING ON FLEXIBLE SUBSTRATES

This invention relates to methods for manufacturing functional multilayer devices on dimensionally unstable substrates, in particular manufacturing of electronic switching devices on flexible, plastic substrates; and to devices fabricated by these methods.

Integration of functional, electronic devices onto flexible substrates will potentially enable new electronic products such as flexible displays, or low-cost intelligent labels, as well as new manufacturing approaches, such as roll-to-roll manufacturing. To manufacture practical electronic devices it is critical that the components of the devices defined in different layers are registered accurately with respect to each other. This is particularly important for manufacturing of thin-film transistors (TFTs). FIG. 1A shows a schematic diagram of a top-gate TFT according to the prior art. On a substrate (1) source (2) and drain (3) electrodes are defined with a separation distance L. In order to achieve the performance requirements for most TFT applications L needs to be on the order of 2-10 μm or less. A semiconducting layer (4), and a dielectric layer (5) are formed on top. A gate electrode (6) needs to be accurately aligned with respect to the source-drain electrodes. The gate electrode needs to overlap with the semiconducting channel of length L of the device in order to be able to control effectively the current flow in the active region of the device. Furthermore, the overlap regions of length $d_{gs}$ and $d_{gd}$ between the gate electrode and the source and drain electrodes need to be controlled very precisely. The overlap regions determine the parasitic gate-source and gate-drain overlap capacitance $C_{gs}$ and $C_{gd}$, respectively. These should generally be as small as possible to improve the switching speed of the TFTs and minimize unwanted capacitive coupling effects. In an active matrix display (FIG. 1B) $C_{gs}$ is particularly important as it determines the capacitive coupling between the signals running along the gate lines and the pixel electrode. When the gate voltage is switched to turn off the TFT at the end a particular addressing cycle $C_{gs}$ causes the voltage on the pixel to follow the gate voltage. This so-called kickback voltage changes the pixel voltage from the intended value to which the pixel had been charged with the signal on the data line.

This problem with parasitic capacitance becomes particularly severe when $C_{gs}$ is large and exhibits variations across the active matrix of TFTs. In this case the kickback voltage is different between different pixels of the display, and induces undesired variations in optical contrast across the display, that cannot easily be compensated for (E. Lueder, Liquid Crystal Displays, John Wiley & Sons, New York (2001)). Background prior art relating to printing onto a glass LED substrate can be found in US 2002/132398 and US 2003/0148560.

The problem is, however, particularly difficult with flexible substrates, such as plastic substrates. Plastic substrates exhibit significant dimensional changes when subject to mechanical stress or temperature variations both of which occur during any manufacturing process. When a plastic substrate such as a thin sheet of polyethyleneterephtalate (PET) is heated it tends to shrink, and therefore the dimension of any pattern which has been defined on the substrate is changing as a result of the heat exposure. Given an arbitrary reference point on such a pattern one can define an absolute distortion field, which attaches to every feature on the substrate a distortion vector equal to the difference vector of the actual position of the feature on the substrate with respect to the reference point and its nominal position that was intended when the pattern was defined. The nominal position can, for example, be determined by a pattern on a photomask that is transferred one-to-one onto the substrate using a photolithographic process.

For many low-cost, flexible substrates such as PET or polyethylenenaphtalate (PEN) typical absolute distortions on a substrate with a dimension of 12-14" are on the order of 50-100 μm. Such distortions cause severe problems in a manufacturing process which requires definition of multiple patterns on top of each other with good registration of the features of an upper pattern to the features of a previously defined pattern over a large substrate area. If two patterns are defined without taking into account the distortion of the substrate which has occurred in between the two patterning steps, the relative position of the upper pattern with respect to the lower pattern will differ between devices in different regions of the substrate. If the substrates distorts in between two such lithographic patterning step, the second pattern will not match the previous one. This will cause variations of the parasitic capacitance in different regions of the substrate. In extreme cases the TFT gate electrode might not even overlap with the channel. This problem is illustrated in FIG. 2, where it is assumed that the bottom source-drain layer 7 has been distorted, such that the gate electrode and interconnect pattern 8 which is supposed to match accurately the source-drain pattern is out-of-registration in some regions of the substrate.

According to a first aspect of the invention there is therefore provided a method of allowing for relative misalignment between different patterned layers when fabricating an electronic device on a flexible or distortable substrate, the method comprising: fabricating a first patterned layer on said substrate to define an operative region of said device using a pattern with a first linewidth; and fabricating a second patterned layer over said first patterned layer using, over said operative region, a second linewidth greater than said first linewidth.

Here a flexible or distortable substrate includes a substrate whose dimensions are prone to change in between processing steps during fabrication, such as plastic, thin glass or steel and large area substrates, such as large-area glass substrates for Generation 6 or higher display manufacturing. The latter although not being bendable, can exhibit significant lateral mechanical distortions, for example of greater than 10-20 μm over the area of the substrate.

Fabrication of an electronic device on a flexible substrate presents special problems, as outlined above, and broadly speaking embodiments of the method effectively allow (and preferably compensate) for distortion of the substrate (rather than, say, just patterning inaccuracies).

Preferably the method also includes connecting for local distortion of the patterned layer when fabricating the second patterned layer. Preferably the method includes configuring the pattern geometry of the second patterned layer such that, within a tolerance, relative misalignment of the first and second patterned layers does not substantially alter correlating characteristics of the device. The tolerance may be predetermined, in particular by the accuracy of a distortion compensation applied to the pattern position of the second conducting layer. Examples of such a tolerance or guard band are a relative displacement or distortion of one pattern with respect to the other of up to 10 μm, 20 μm, 50 μm, 100 μm, 200 μm, 500 μm, or 1000 μm (or more). In embodiments the first patterned layer has at least one electrode defining the operative region and the second patterned layer has an electrode entirely over the operative region. Additionally or alternatively a portion of the first patterned layer defining the operative region may be fabricated to include extension portions substantially symmetrically disposed to either side of a portion of the second patterned layer associated with the operative region, preferably narrower than the linewidth of the second layer. Preferably the linewidth used for the second patterned layer is greater than that used for the first patterned layer by a factor of at least three, more preferably by a factor of five.

The above described method may be employed to fabricate a transistor, in particular a thin film transistor (TFT), or a capacitor, or one or more types of active or passive electronic component. The method is particularly useful for fabricating an active matrix display such as an active matrix electroluminescent, electrophoretic or liquid crystal display, but applications also include fabrication of a passive matrix display, fabrication of an image sensor, fabrication of an integrated logic circuit, and the like.

In another aspect the invention provides an electronic device comprising: a flexible or distortable substrate; a first conducting layer having a pair of longitudinally extending first layer conductors between which lies an operative region of said device; and a second conducting layer above said first conducting layer, said second conducting layer having a second layer conductor above said operative device region; and wherein said second layer conductor extends beyond at least one of said longitudinal first layer conductors in a lateral direction substantially perpendicular to said longitudinal direction.

Generally the device will also include an intermediate layer between the first and second conducting layers, for example a layer of dielectric or active material.

Preferably the flexible substrate is a plastic substrate, such as a low-cost, but mechanically unstable flexible substrate, such as PEN or PET although other types of substrate material may also be employed. The method may also be applied to distorted substrate patterns on other substrates such as engineered, plastic substrates, glass or steel substrates, as well as flexible substrates mounted onto rigid carriers, all of which may exhibit significant substrate distortions over large-areas. Preferably the electronic device is fabricated using molecular electronic, in particular organic materials such as an organic semiconductor; either organic (including organo-metallic) or inorganic conductors may be employed. Preferably the device employs materials which are suitable for deposition by means of solution processing techniques. Details of these are described in the applicant's earlier application WO 01/47043, the contents of which are hereby incorporated by reference.

The invention also provides a multilayer electronic device, the device having: a flexible or distortable substrate; a first patterned layer defining a first pattern of first layer material; a second patterned layer defining a second pattern of second layer material; wherein said first patterned layer is between said substrate and said second patterned layer; wherein a portion of said first pattern defines an operative region of said device; and wherein a geometry of said first and second patterns is configured such that within a tolerance relative misalignment of said first and second patterns does not substantially alter an operating characteristic of said device defined by an overlap of said second pattern with said portion of said first pattern defining said operative region of said device.

Preferred embodiments of the invention will now be described, by way of example only, with reference to the following figures in which.

FIG. 8 (A) Droplet positions for k=0 and k=K laid on top of each other showing change of y-pitch from 176 to 179 μm (B) Droplet positions for subsequent trigger pulses for m=97-100 nozzle, showing that the distance between subsequent droplets varies by less than 1 μm in spite of the continuous rotation of the rake angle of the head.

Figure 9:
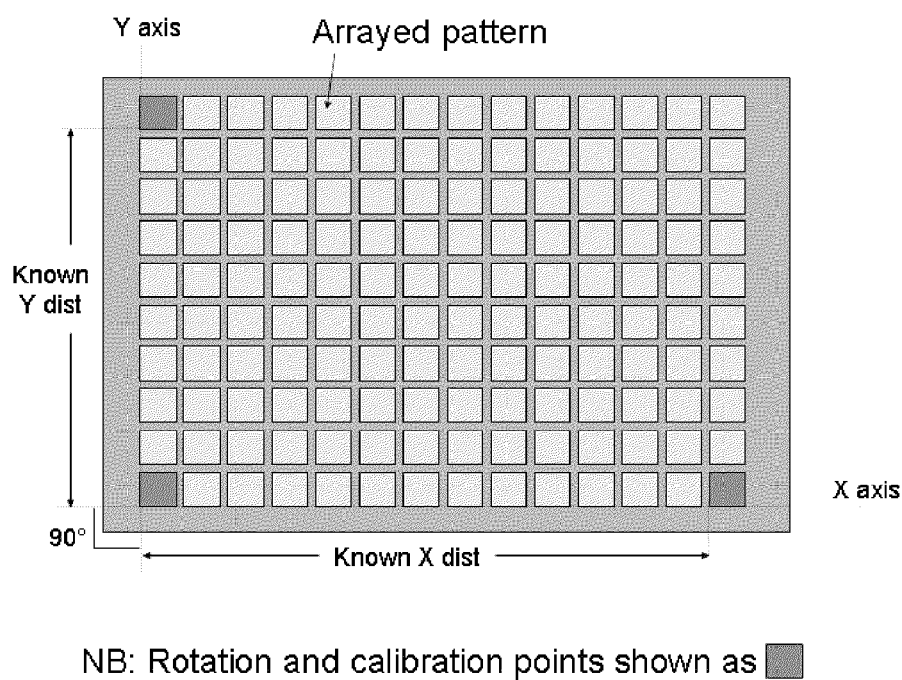

FIG. 9 shows a schematic diagram for a method to measure distortions on a flexible substrate.

FIG. 10 shows plots of the measured distortion on a 60×80, 50 dpi active matrix substrate on PET.

FIG. 11 shows plots of the distortion after correcting each row of pixels for an average distortion in the y-direction.

FIG. 12 shows possible signal waveforms for triggering of neighbouring nozzles in order to compensate for distortion of the pitch along the print direction.

Broadly, we will describe a method by which high-performance TFT arrays with well-defined, and uniform parasitic capacitance can be defined on distorted, flexible substrates. The method comprises fabricating a multilayer electronic device on a flexible substrate comprising at least a first and a second patterned layer, wherein the first patterned layer is defined with a linewidth that is smaller than the linewidth of the second patterned layer, and the second patterned layer is defined by a patterning technique which is capable of correcting for local distortions of the pattern of said first layer on top of the flexible substrate and wherein the first patterned layer is laid-out in such a way that the geometric overlap between a portion of the second layer and a portion of the first layer is insensitive against small variations of the position of the second patterned layer.

Figure 1A:
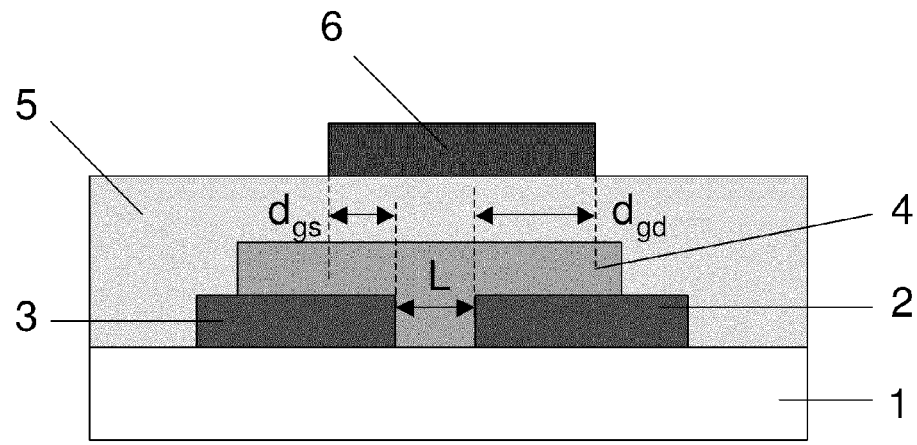
FIG. 1 shows a schematic cross-sectional diagram of a TFT according to the prior art (A), and an equivalent circuit diagram of a TFT used as a pixel switch in an active matrix array (B).
Figure 1B:
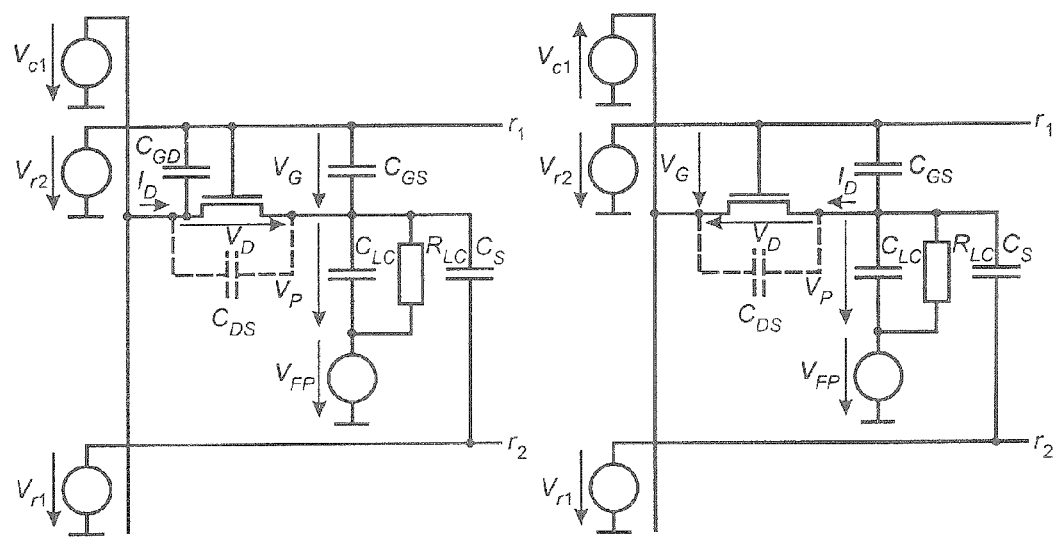
Figure 2:
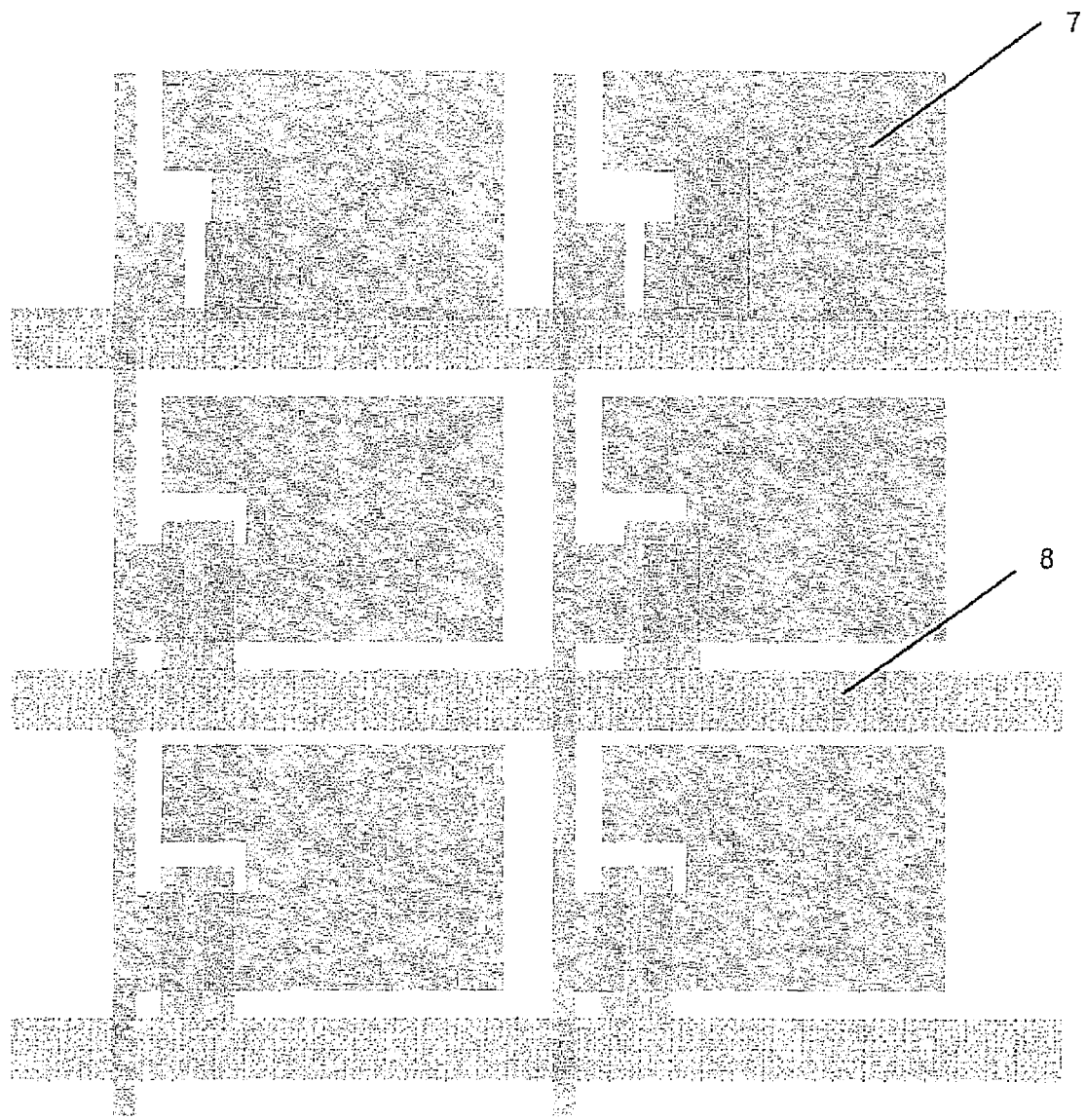
FIG. 2 illustrates the problem of accurate registration between source/drain and gate electrode patterns for a TFT manufacturing process according to the prior art.
Figure 3:
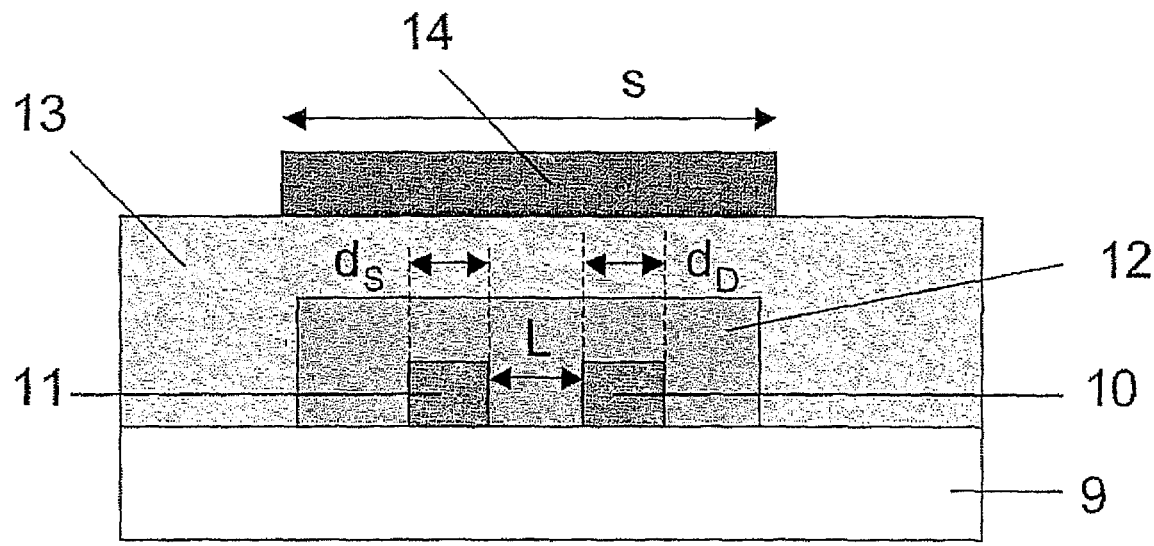
FIG. 3 shows a schematic cross-section of a TFT fabricated according to an embodiment of the present invention.

FIG. 3 shows a cross-sectional diagram of a TFT formed according to an embodiment of the present invention. On the substrate 9 a metallic source-drain electrode structure is defined. The linewidths of the source (10) and drain (11) are $d_S$ and $d_D$, respectively. In many cases $d_S=d_D=d$. In principle, d should be chosen as small as possible with the particular patterning technique employed. However, in many practical cases d is limited by the minimum conductivity which the electrode needs to exhibit, or by the need to achieve a high patterning yield without line breaks, which are more likely to occur the narrower the linewidth. This is a particularly important consideration on flexible substrate on which the surface topography can exhibit significant roughness making narrow lines susceptible to line breaks. Therefore, if the first pattern is defined by photolithography d is preferably on the order of 1-20 μm, most preferably on the order of 5 to 10 μm.

The source-drain electrode structure can be patterned by any technique that is capable of achieving the required linewidth resolution. Suitable techniques include, but are not limited to, photolithography, imprint lithography, soft lithography, high-resolution inkjet printing combined with surface energy substrate prepatterning, direct-write laser patterning, or laser ablation.

The material of the source-drain electrode may be an inorganic metal such as gold deposited by vacuum evaporation or sputtering, a solution processible metal, such as a nanoparticle or precursor metal which is deposited from solution and then sintered into a high-conductivity deposit, or a metal deposited by electroless plating techniques.

On top of the source-drain structure the semiconducting layer (12) is deposited, either as a continuous film, or patterned into active layer islands. Preferably, the semiconducting layer is patterned into an active layer island in order to reduce leakage currents between neighbouring devices in a high density array. The semiconducting layer can be deposited either as a thin continuous film, and subsequently be patterned by a subtractive patterning technique such as photolithography, or directly written onto the substrate by a technique such as inkjet printing.

Preferably the active semiconducting layer is patterned by a technique which is capable of distortion compensation (examples are described later). Although the exact position of the active layer island with respect to the source-drain stricture is less critical than the relative positioning of the source-drain and gate electrodes, it is preferably ensured that everywhere on the substrate the active layer island structure overlaps fully with the active channel region of the TFTs.

The semiconducting material is preferably a solution-processible material such as a conjugated polymer semiconductor, a soluble small molecule organic semiconductor, or an inorganic nanoparticle, nanowire or other solution processible inorganic semiconductor. Examples are described in US 2003/059984, hereby incorporated by reference. Preferably, the semiconductor is selected such that it can be deposited at room temperature and does not require annealing at temperatures above 100 to 150° C. in order to exhibit good performance and operating stability. Most preferably, the semiconducting material does not require any post-deposition processing at elevated temperatures. This is to minimize distortions of the source-drain pattern on the flexible substrate prior to deposition of the gate electrode. If the substrate needs to be annealed at temperatures above 100 to 150° C. in order to exhibit good electrical properties, a higher temperature substrate, such as polyimide or polyethersulfone may need to be used in order to avoid very large distortions, for which the subsequent gate electrode patterning technique might not be able to compensate (see below).

Subsequently, the gate dielectric layer (13) or a sequence of dielectric layers is deposited, either as a continuous film, or patterned to expose via-hole interconnections to the underlying metal layer on the substrate (as described in WO 01/47043). In many cases there is no need for patterning of the dielectric layer, and it can be deposited as a continuous film by techniques such as, but not limited to, spin coating, inkjet printing, blade coating, meniscus coating, capillary coating, or spray coating.

The dielectric material(s) is (are) preferably solution-processible materials such as organic polymer dielectrics, such as, but not limited to, polymethylmethacrylate, polyethylene-co-polypropylene, precursor dielectrics, such as benzocyclobutene, or hybrid organic-inorganic dielectrics such as spin-on glass. Preferably, the dielectric is selected such that it can be deposited at room temperature and does not require annealing at temperatures above 100 to 150° C. in order to exhibit good dielectric properties and operating stability. Most preferably, the dielectric material does not require any post-deposition processing at elevated temperatures. This is to minimize distortions of the source-drain pattern on the flexible substrate prior to deposition of the gate electrode. If the substrate needs to be annealed at temperatures above 100 to 150° C. in order to exhibit good electrical properties, a higher temperature substrate, such as polyimide or polyethersulfone may need to be used in order to avoid very large distortions, for which the subsequent gate electrode patterning technique might not be able to compensate (see below).

Subsequently, the gate electrode (14) is formed on top of the surface of the gate dielectric. Thus there is generally one or more (in this example two) intermediate layers between the lower and upper patterned conducting layers.

The gate electrode is preferably patterned by a technique that is capable of locally compensating for distortions of the previously deposited source-drain pattern on the substrate. Prior to the deposition of the gate electrode the source-drain distortion pattern on the substrate is measured, and the deposition of the gate electrode material is then adjusted such that in all locations on the substrate the gate pattern is formed with accurate registration with respect to the source-drain pattern on the substrate. Under typical conditions on a low-cost PET substrate and a substrate size of 10-12" the patterning technique needs to be able to compensate for relatively large maximum absolute distortions on the order of 100 to 150 µm. In embodiments the compensation for substrate distortion is very important. Since in a high-resolution display application the absolute substrate distortion over the size of the display can be comparable to the pixel pitch, sufficient alignment cannot generally simply be achieved by making the gate pattern sufficiently wide in order to ensure that the gate electrode always overlaps with the source-drain feature without taking into account the substrate distortion. However such techniques can generally only be effectively applied if the substrate size and distortion is sufficiently small that the resolution and aperture is not much affected. To realize an active matrix display with a pixel resolution of 150 dpi, and an aperture ratio of more than 65% the linewidth of the gate electrodes should not be larger than typically 20 to 70 µm, i.e. is significantly smaller than the maximum absolute distortion of a low-cost plastic substrate.

Patterning techniques which are capable of local distortion compensation include, but are not limited to, direct-write deposition techniques such as inkjet printing, dispensing, laser forward transfer patterning, or other direct-write techniques, such as direct-write laser patterning, laser ablation or direct-write photolithography. Other examples of direct-write printing techniques include inkjet printing of catalyst lines followed by subsequent electroless plating leading to patterned growth of metal gate electrodes in those regions in which the catalyst was deposited.

In direct-write deposition techniques, such as inkjet printing, the positioning of the materials deposition unit can be adjusted to compensate for the distortion of the substrate, and deposit the material in accurate registration with a distorted pattern on the underlying substrate. A preferred patterning technique is inkjet printing using an array of multiple nozzle printheads, each of which is mounted on a position stage capable of rotating and translating the printhead in the direction perpendicular to the print direction. This distortion compensation scheme is discussed in more detail below.

In direct-laser writing or direct-write photolithography a photosensitive material/resist is exposed to a focused laser beam which is scanned across the sample. The exposure to the laser beam causes a change in the physical properties of the material which enables it to be developed/patterned. By correcting the positioning of the laser beam for the substrate distortion accurate registration can be achieved over a large substrate area.

Also some forms of mask based lithography are capable of distortion compensation (see for example, Zemel, et al., Proceedings of Printed Circuit Expo IPC, Long Beach, Calif., Mar. 26-28, 2002).

The material of the gate electrode might be an inorganic metal such as gold deposited by vacuum evaporation or sputtering, a solution processible metal, such as a nanoparticle or precursor metal, such as silver or gold, deposited from solution, and then sintered into a high-conductivity deposit, or a metal deposited by electroless plating techniques, such as copper.

The linewidth of the gate electrode is preferably significantly larger than the linewidth of the source-drain electrode, such that the gate electrode covers the entire source-drain electrode structure as well as the channel region of the TFT. Preferably, the linewidth of the gate electrode is larger by a factor of 3 than that of the source and drain electrodes. Most preferably, the linewidth of the gate electrode is larger by a factor of 5 than that of the source and drain electrodes. In many applications, such as active matrix display applications the linewidth is limited by the resolution and aperture ratio specification of the display. Typically for a 100-150 dpi display the linewidth of the gate electrode is on the order of 20-70 µm.

Figure 4A:
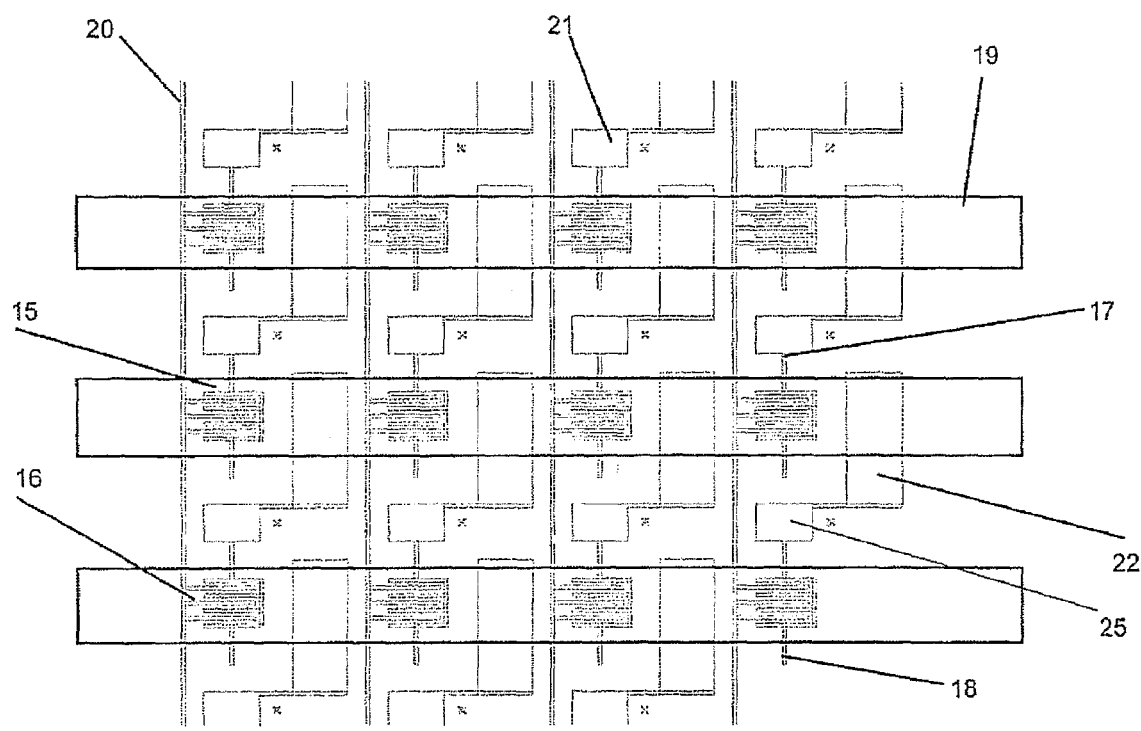
FIG. 4 shows alignment tolerant designs for the source-drain electrodes of an active matrix array TFT on a flexible substrate according to the present invention.
Figure 4B:
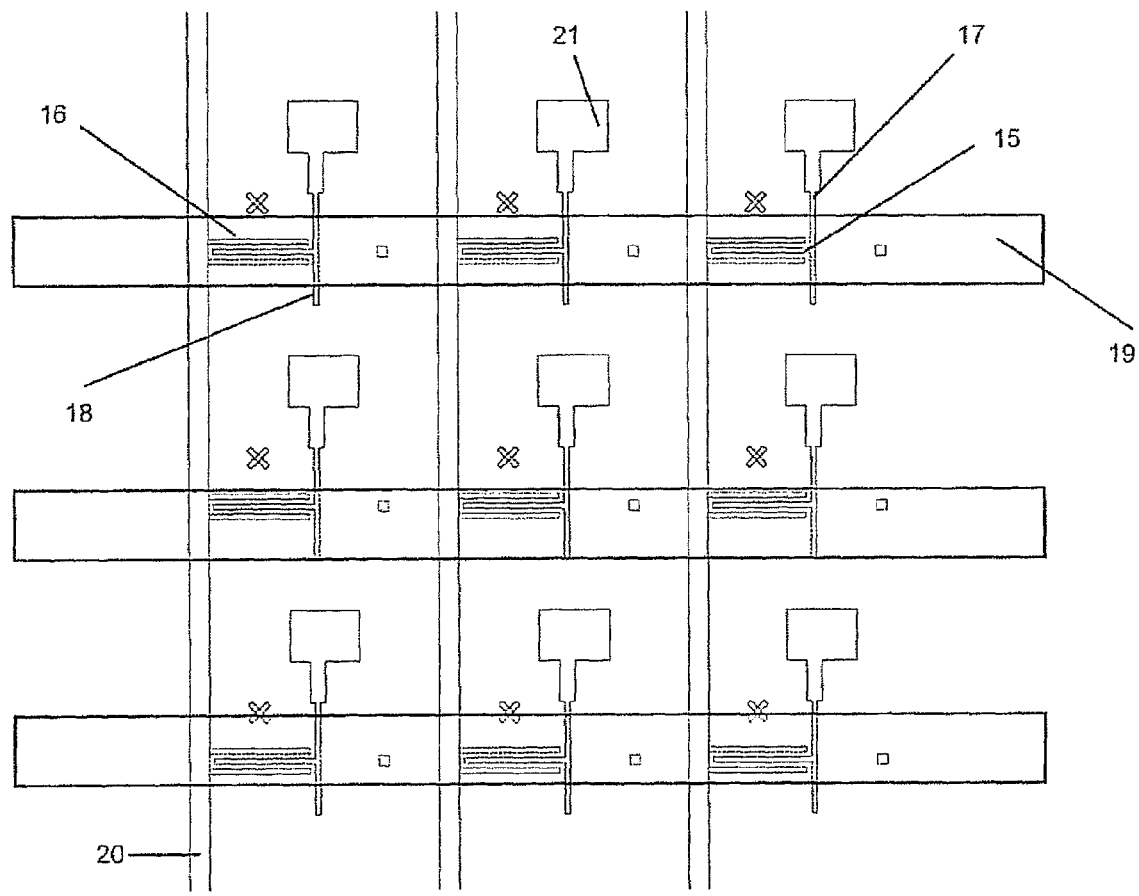

By choosing the gate linewidth to be significantly larger than that of the source-drain electrodes the source-drain electrode pattern can be designed in such a way that the parasitic overlap capacitance is insensitive to small variations of the position of the gate electrode. This is achieved by laying-out the source-drain electrode fingers such that they are covered entirely by the gate electrode, and configuring the portion of the source and drain interconnect that overlaps with the gate electrode such that the overlap capacitance is insensitive to the exact position of the gate electrode. FIG. 4 shows example embodiments. The source (15) and drain (16) electrode fingers are designed as interdigitated arrays with fingers aligned along the direction of the gate line. The fingers are preferably sufficiently narrow, and the number of fingers is chosen such that the interdigitated array is always covered completely by the gate electrode, and located sufficiently far away from the edge of the gate electrode line, that even if the position of the gate electrode varies due to imperfect distortion compensation the source-drain electrode is always located entirely underneath the gate electrode. The registration and relative alignment accuracy of most distortion compensation schemes on a flexible substrate is limited to a few microns. In the case of inkjet printing, for example, the alignment accuracy is limited by the droplet position inaccuracy related to irregular spreading of ink droplets on the surface and variations of the droplet flight direction of ink droplets ejected from the printhead nozzles. For typical inkjet printheads and print conditions this is on the order of 5-10 µm. Even if the distortion of every print feature is measured accurately and the positioning of the printhead is corrected accordingly, the alignment accuracy will be limited by this droplet positioning inaccuracy.

The source interconnect is laid out such that one section 17 connects to the pixel electrode 21, and another section 18 (a lateral extension portion or line) extends beyond the gate electrode edge. When the position of the gate electrode varies (laterally, or perpendicularly to the longitudinal direction of a finger) the capacitive overlap with one of the interconnects sections 17 or 18 increases by a certain amount, while the capacitive overlap of the other interconnect section decreases by substantially the same amount, such that the total source-gate overlap capacitance is insensitive to the position of the gate electrode. Similarly, since the drain/data interconnect is laid out as a (continuous) line crossing the gate line, also the drain-gate capacitance is insensitive to the position of the gate electrode.

For such alignment tolerant device design it is very important that the gate patterning technique is capable of distortion compensation, otherwise it may not be possible in general to guarantee that the gate line position falls within the tolerance band in which the source/drain-to-gate overlap capacitance is substantially independent of gate position. If the gate patterning was performed by a patterning technique that does not compensate for substrate distortions, which as shown above can amount to more than 50-100 µm, the gate line position could easily be outside the tolerance band of the alignment tolerant structure. As a consequence the overlap capacitance would depend on the gate line position, or in the worst case the gate would cease to overlap with the associated source-drain structure.

In embodiments where it is desired to minimize the absolute value of the overlap capacitance in such alignment-tolerant layouts of the source-drain fingers it is important to define the source-drain electrodes, and interconnections with the minimum possible linewidth that the patterning technique can achieve with high yield, and/or that is compatible with the requirement for a highly conductive source-drain line or other factors.

The specific design shown in FIG. 4 is merely illustrative. The skilled person will appreciate that other designs can be used to achieve a substantially similar effect.

Figure 4C:
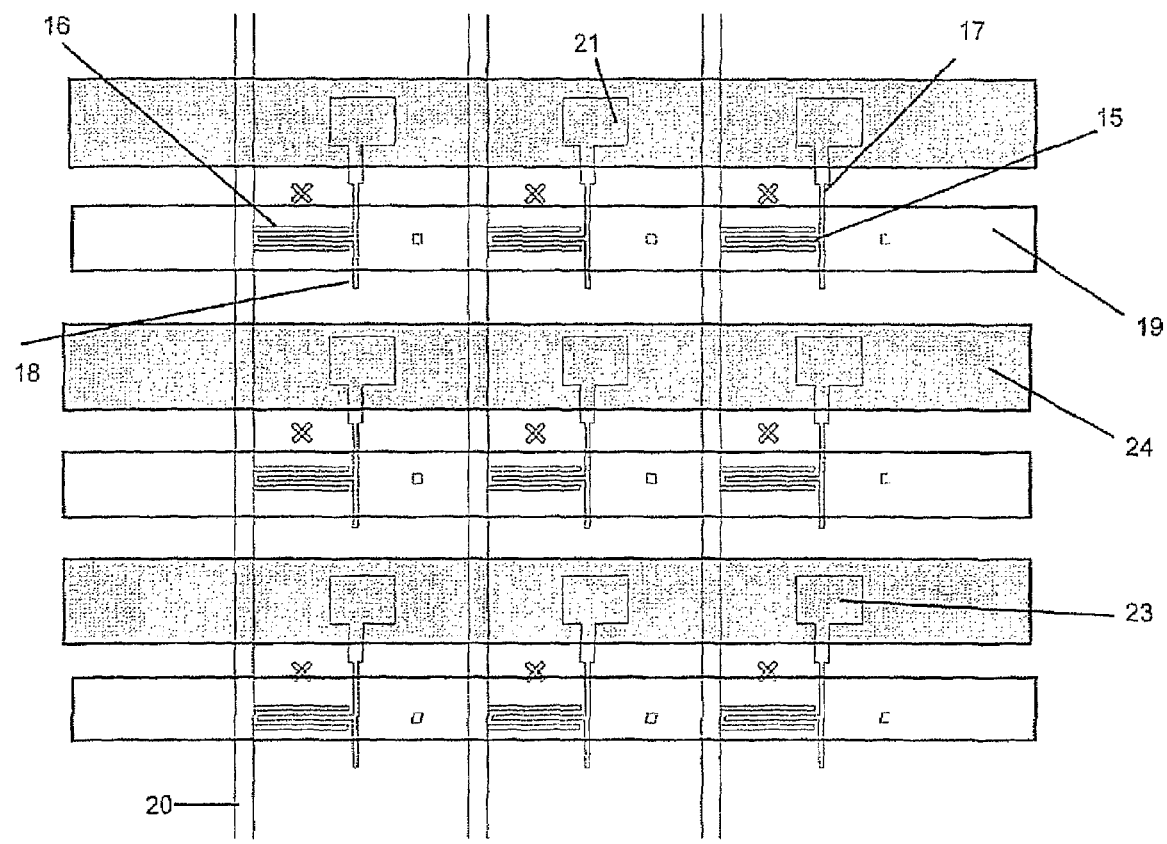

In another embodiment the invention also allows integration of a pixel capacitor into the structure, in which the value of the pixel capacitance is insensitive to small variations of the position of the gate electrode. A pixel capacitor can be used to reduce the effect of the parasitic overlap capacitance. The kickback voltage induced on the pixel electrode by the switching gate voltage is smaller the larger the capacitance of the pixel electrode is (E. Lueder, Liquid Crystal Displays, John Wiley & Sons, New York, 2001). A pixel capacitor can be incorporated by arranging a portion 22 of the pixel electrode to overlap with the gate electrode of the n−1th gate interconnect line which is at ground potential when the pixel TFTs in the n-th row are being addressed (see FIG. 4A). Alternatively, a separate bus line 24 can be defined at the gate level to overlap with the pixel capacitor portion of the pixel electrode on the source-drain level (see FIG. 4C). The shape of the pixel capacitor portion of the pixel electrode 22 and 24, respectively, can be defined such that the value of the pixel capacitor is independent of the position of the gate/bus line. In FIG. 4 this is achieved by arranging the pixel capacitor to be located entirely underneath the gate/bus line with only a very narrow interconnect connecting it to the source electrode of the TFT. Alternatively, if sufficient space is available the pixel capacitor can also be arranged to extend beyond the gate/bus line in a symmetric fashion, such that when the position of the gate/bus line varies the pixel capacitance does not substantially change.

Again for such alignment tolerant pixel capacitor designs it is very important that the gate patterning technique is capable of distortion compensation, otherwise it will not be possible in general to guarantee that the gate line positions fall within the tolerance band in which the pixel capacitance is substantially independent of gate position.

The layout for TFT and pixel capacitor shown in FIG. 4 is particularly suitable for multilayer pixel architectures such as the one disclosed in PCT/GB2004/000433. In this structure the pixel electrode addressing the display medium is defined on a third metal level, and is connected to the TFT source electrode, and pixel capacitor electrode on the source-drain level through a via-hole interconnection. This allows realizing a high-aperture ratio which is not compromised by the space taken up by the TFT and the pixel capacitor. In the layout of FIG. 4A the via-hole interconnection could be located on pad region 25 of the source-drain level pattern.

The use of the alignment-tolerant designs on flexible substrates according to embodiments of the present invention depends on the use of a distortion compensation scheme which can ensure that the position of the gate electrode is (practically) never so far away from the corresponding source-drain structure that the gate electrode only partially overlaps with the source-drain fingers. In the following we describe two specific examples of distortion compensation schemes which can be used in the case of direct-write deposition technique such as inkjet printing for the deposition of the gate electrode, and in the case of patterning by laser ablation.

EXAMPLE 1

Inkjet-Based Distortion Compensation

To achieve high-throughput manufacturing the materials deposition unit needs to have many parallel channels. In the case of an inkjet printhead each heads comprises a large number (several 100's) of nozzles, which car be operated independently from each other, and a high-volume manufacturing inkjet printer will need to have several individual printheads mounted together. The nozzles on a printhead are typically arranged in a linear array with a well defined nozzle pitch d on the order 250 µm. For example, in order to achieve a minimum tact time the printer should ideally be able to define an arbitrary pattern on the substrate in a single pass, i.e., in the direction perpendicular to the print direction several printheads need to be mounted in order to cover the full width of the substrate.

Figure 5:
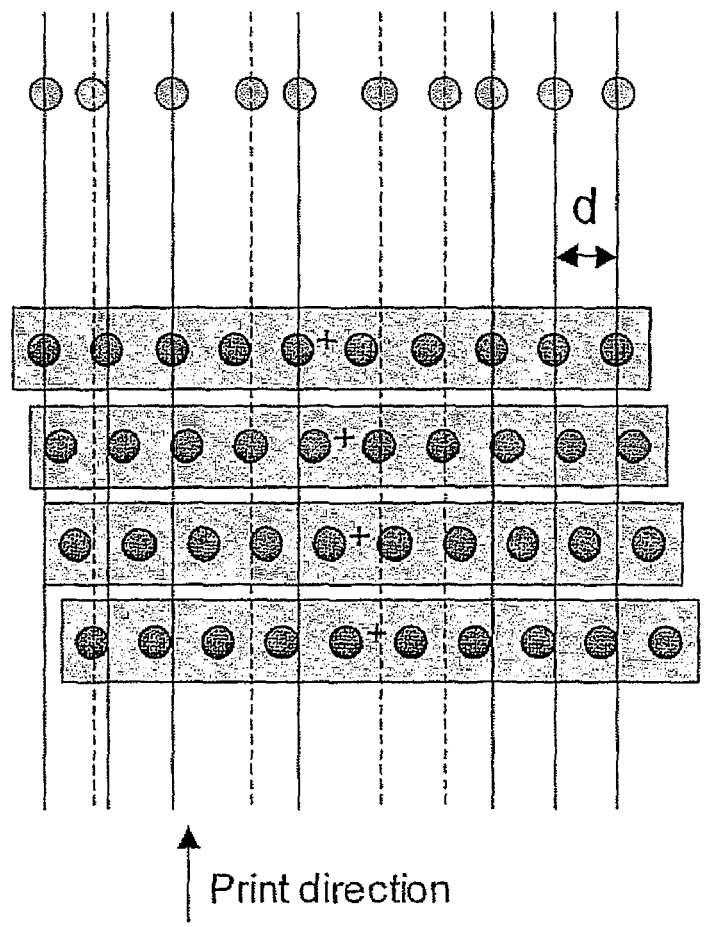
FIG. 5 illustrates a distortion compensation scheme for printing of the second layer.

In such a multiple head assembly complex distortion compensation algorithms need to be employed in order to ensure that an arbitrary substrate distortion can be compensated for. One principal scheme is illustrated in FIG. 5. N printheads are mounted behind each other each of which is shifted by a defined distance d/N perpendicular to the print direction. In the ideal case in which the substrate is undistorted and the pitch of the pattern to be printed is equal to the nozzle pitch (if the latter is not the case the head can be raked by a certain angle to achieve the desired pattern pitch), the pattern can be defined entirely by firing the nozzles of one printhead only. If the substrate is distorted and the printed pattern needs to compensate for this distortion each portion of the pattern can be printed with that nozzle on a particular printhead which comes closest to the required position (FIG. 5), when moving the printhead assembly along the print direction. If N is chosen such that d/N is smaller than the required registration accuracy an arbitrary distortion pattern can be compensated for in this way.

This technique requires a large number of printheads, and it also means that a large number of nozzles will not be firing regularly, but will remain idle for significant periods of time. In the case of inkjet drying of the ink on the nozzle plate is a serious problem, which can cause degradation of the directionality of the droplets emitted from the nozzle, or in the worst case nozzle blockage. In order to avoid such problems it is desirable that all nozzles are in use regularly, and that no nozzle remains idle for prolonged periods of time. The distortion compensation scheme of FIG. 5 puts relatively stringent requirements on ink formulation and printhead design to ensure reliable and uniform droplet ejection.

Figure 6:
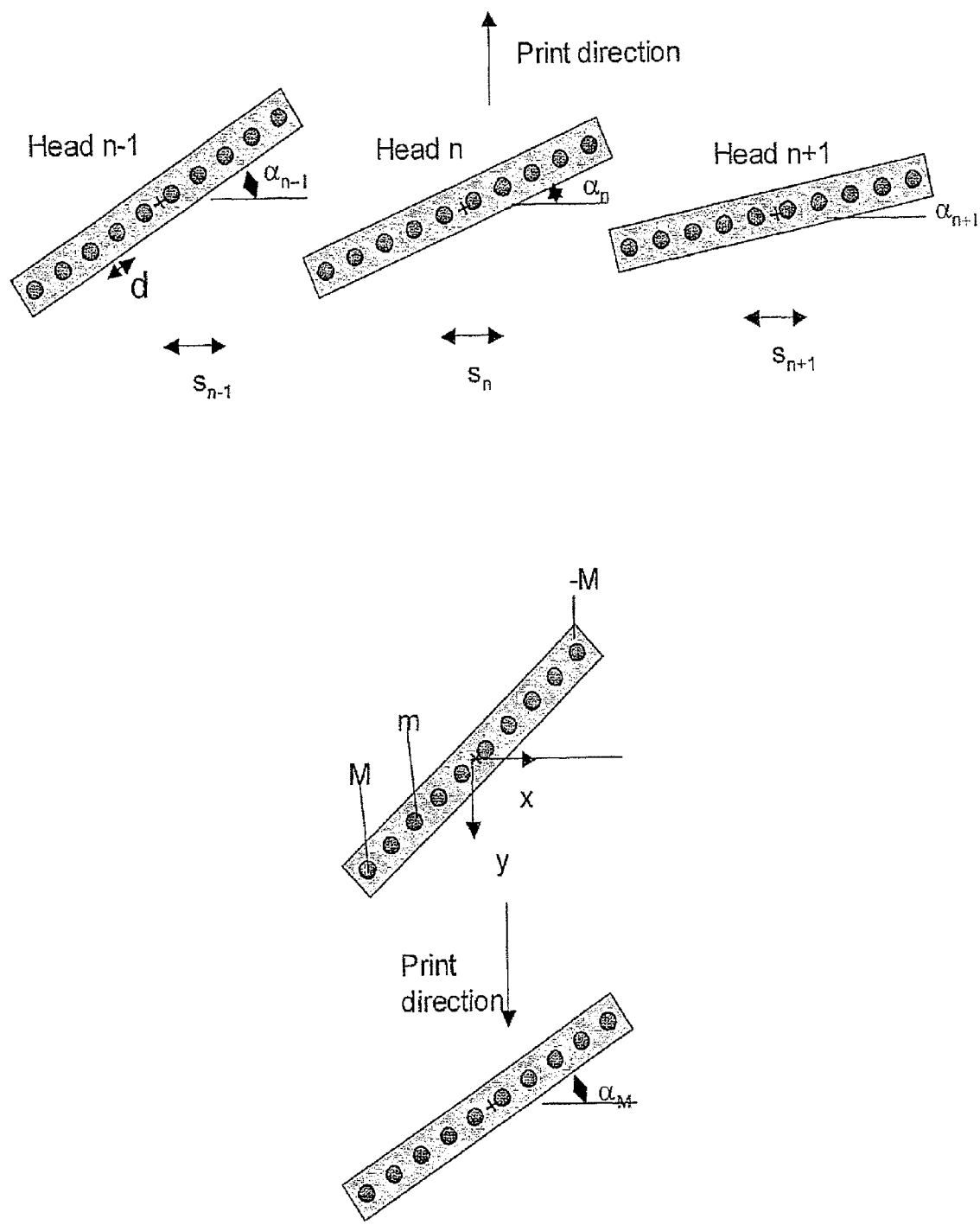
FIG. 6 illustrates another distortion compensation scheme for printing of the second layer.

An alternative distortion compensation scheme for a multiple-nozzle, multiple-head direct-write printer which enables compensation of arbitrary distortions with a minimum number of printheads, and regular use of all nozzles of the assembly is shown in FIG. 6. The method is based on mounting each printhead on a rotation-translation stage and adjusting both the rake angle of each head, and the lateral position of each head in the direction perpendicular to the print direction continuously during the printing step in order to compensate for the distortion of a pattern on the substrate with respect to which the printed material deposits need to be aligned accurately.

The distortion of the pitch in the y-direction $\Delta y(x,y)$ of a periodic pattern is compensated for in the following manner. The printer unit is designed such that several printheads are arranged in an essentially linear fashion to cover a certain swath width in the y-direction perpendicular to the print direction. Preferably, the swath width is equal to or larger than the width of the substrate such that the pattern call be printed in a single pass. Each printhead of the N printheads is mounted on a mechanical positioning stage which allows the $n^{th}$ printhead (a) to be rotated independently by an arbitrary rake angle $\alpha_n$, and (b) to be translated independently perpendicular to the print direction by a distance $s_n$ (FIG. 6). In addition, the positioning stage might also allow other motions of the printhead such as adjustment of the vertical print distance between the nozzle plate and the substrate plane or the lateral position of the printhead along the print direction. The rake angle $\alpha_n$ of each head and the y-position of each head is continuously adjusted during the printing to match the local y-pitch perpendicular to the print direction.

Figure 7A:
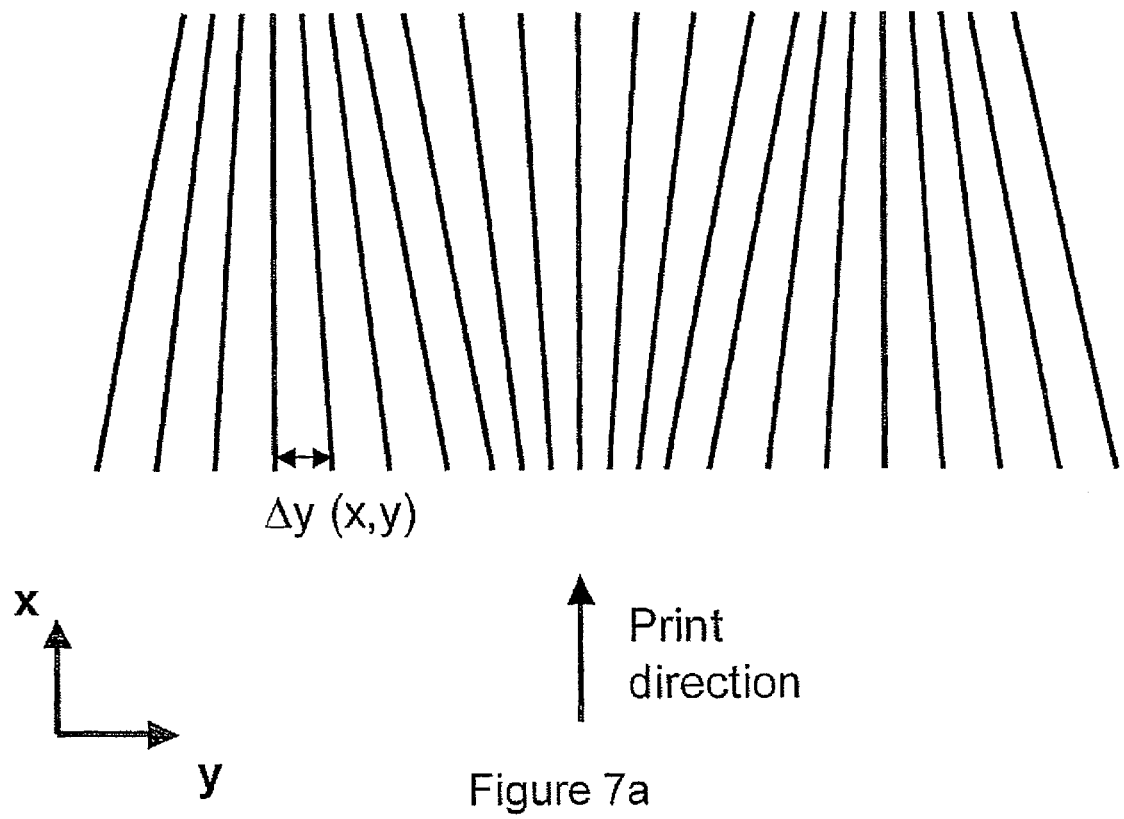
FIG. 7 illustrates different distorted patterns to be printed (A) pattern of continuous lines with variable line pitch across the substrate; (B) pattern of islands with variable pitch in both a x and y direction.

In one technique we consider a pattern of quasiparallel lines to be printed (FIG. 7A). The lines are not perfectly parallel because they are assumed to match and overlap with all underlying pattern that has been distorted, such that in some regions the pitch increases along the print direction, while in other regions the pitch might even be decreasing. In the absence of distortion the rake angle of all heads would be the same, and assuming that the lines are parallel to the print direction would be set such that d·cos $\alpha=\Delta y$=constant. The nozzles are firing continuously and the print speed and firing frequency of the nozzle are adjusted as to obtain a continuous line deposit of material on the substrate. In some case the lines might be printed in multiple passes by filling in gaps left in previous passes. This might be necessary if tile wetting conditions on the substrate are such, that continuous line deposits cannot be fabricated in a single pass. However, if the underlying pattern on the substrate is distorted the local pitch $\Delta y(x, y)$ between neighbouring lines needs to vary smoothly over the substrate in order to provide accurate registration with the distorted substrate pattern. Such a situation arises for example when printing the conducting gate or data interconnects on an active matrix display, where thin film transistors (TFT) are located on each pixel of the display. All the transistor gates in one row are connected by a straight high-conductivity gate interconnect line. The position of each of the gate electrodes needs to overlap with the channel of the TFT defined by the pattern of source-drain electrodes that was predefined on the substrate. If the substrate distorts in between the source-drain and gate patterning step, the pitch between two gate interconnecting lines will need to be adjusted both in the direction perpendicular to the print direction, but also along the print direction. In many practical situations the variation of the local pitch is small over the length scale of one single printhead, i.e. can be neglected compared to the required tolerance for gate positioning (see distortion data below), but becomes significant over larger distances.

At the beginning of each swath each printhead is set to a different rake angle taking into account variations of the line pitch over the full swath width. Preferably, the print direction is chosen to be along the direction of the lines. The rake angles $\alpha_n$ are initially adjusted such that each printhead matches the local line pitch at the edge of the substrate (x=0):

$$d \cdot \cos \alpha_n(x=0) = \Delta y(0, y_n) \quad (1)$$

where $y_n$ is the y-position of the centre of the n-$^{th}$ printhead, and $\Delta y(0, y_n)$ is the y-pitch of the pattern to be printed averaged over the region which the n$^{th}$ printhead is covering at the beginning of the print swath (x=0).

During each print swath the rake angles $\alpha_n$ and translation values $y_n$ are continuously adjusted as the printhead assembly is moving along the print direction to adjust for the variations of the line pitch along the print direction:

$$d \cdot \cos \alpha_n(x_n) = \Delta y(x_n, y_n) \quad (2)$$

$\Delta y(x_n, y_n)$ is the y-pitch of the pattern to be printed averaged over the region which the n$^{th}$ printhead is covering at a position $x_n$ of the print swath.

Simultaneously, the translation stages in the y-direction are used to shift each printhead by an amount $s_n$ in the y-direction to ensure that the array of lines printed by the assembly of printheads is in the correct position with respect to the underlying pattern on the substrate perpendicular to the print direction. This can be achieved in a number of ways. For example, for each set of rake angles the values of $s_n$ can be chosen such that the distance between the M$^{th}$ nozzle of the n-1$^{th}$ head to the first, -M$^{th}$ nozzle of the n$^{th}$ head projected on the y-direction (FIG. 6) always matches the local pitch $\Delta y (x_n, (y_{n-1} + y_n)/2)$ at the edge between the two printheads. Other algorithms can also be used. Note that any adjustment in rake angles during the swath needs to be accompanied with an adjustment of $s_n$.

By adjusting the values of $s_n$ continuously it is also possible to adjust for deviations of the direction of the lines from the print direction. This can arise if the array of lines makes an angle $\beta$ with the print direction, either because of initial misalignment of the substrate or because of a distortion of the substrate which requires the direction of the lines to change across the substrate without necessarily requiring an adjustment of line pitch. In this case, all printheads are continuously adjusted by the same amount such that $ds_n/dt = v \cdot \tan \beta$, where t is the time. If $\beta$ is constant across the substrate $s_n = v \cdot \tan \beta \cdot t + s_n(t=0)$ independent of n. Note that this overall translation of the values of $s_n$ can be superimposed onto any relative adjustments of the values of $s_n$ to compensate for any variation of $\Delta y(x_n, y_n)$ over the width of the print swath. If $\beta$ varies in a complex manner across the substrate $s_n(t)$ follows a more complex solution of the differential equation, and can also depend explicitly on n.

In this way it is possible to print an array of quasi-parallel lines with arbitrary variation of line pitch along the print direction, and with a variation of line pitch perpendicular to the print direction as long as the latter is sufficiently small on the length scale of one of the printheads, i.e. that the variation of $\Delta y$ on the lengthscale of one printhead is smaller than the registration accuracy which needs to be achieved. This is in fact satisfied for many practical flexible substrates, including low-temperature plastic substrates, such as heat-stabilized PET and PEN as long as the maximum process temperature does not exceed values on the order of 150-200° C. Compared to the distortion compensation scheme of the prior art our method has the advantage that no additional printheads are required to implement the distortion compensation, and essentially all nozzles are firing continuously.

The specific procedures described above for adjusting the values of $\alpha_n$ and $s_n$ during the print swath provide an example of the technique for using the printhead assembly for correcting substrate distortion, but other techniques can also be used.

For this technique is desirable to ensure that even for the two outermost nozzles of each head which experience the largest rotational motion as the rake angles are adjusted continuously the distance between two subsequently fired droplets along the same line does not significantly change. Otherwise, there can be some risk of breaks in the line arising if the distance between neighbouring droplets exceeds a critical value.

FIG. 8 shows simulations of the droplet positions for a particular printhead for different phases k of the trigger signal. For this simulation we have made the following typical assumptions:

Substrate size: 1 m$^2$ substrate
Print speed v=1 m/s
Nozzle pitch d=250 μm
Firing frequency f=32 kHz: This implies that for the 0$^{th}$ nozzle at the centre of the printhead the x-position on the substrate of the droplets fired by the k$^{th}$ trigger pulse of the nozzle is equal to $k \cdot L_x = k \cdot v/f = k \cdot 31.25$ μm.
Assume local substrate y-pitch changes by 1% from one end of the substrate to the other end, for example from 176.8 μm near one edge x=0 ($\alpha_0 = 45°$) to 179.3 μm near the other edge x=1 m ($\pi_K = 44.2°$).
For simplicity pitch for firing the $k_{th}$ droplet is assumed to change linearly, i.e, $\alpha_k = \alpha_0 + (\alpha_K - \alpha_0) \cdot m/N$, where K=32000 is the index G of the final droplet printed during the swath.

Under these assumption we obtain for the position (in μm) of the k$^{th}$ droplet from the m-th nozzle:

$$(x_k, y_k)_m = (m \cdot 250 \cdot \sin(\alpha_k) + k \cdot L_x, m \cdot 250 \cdot \cos(\alpha_k)) \quad (3)$$

Figure 8A:
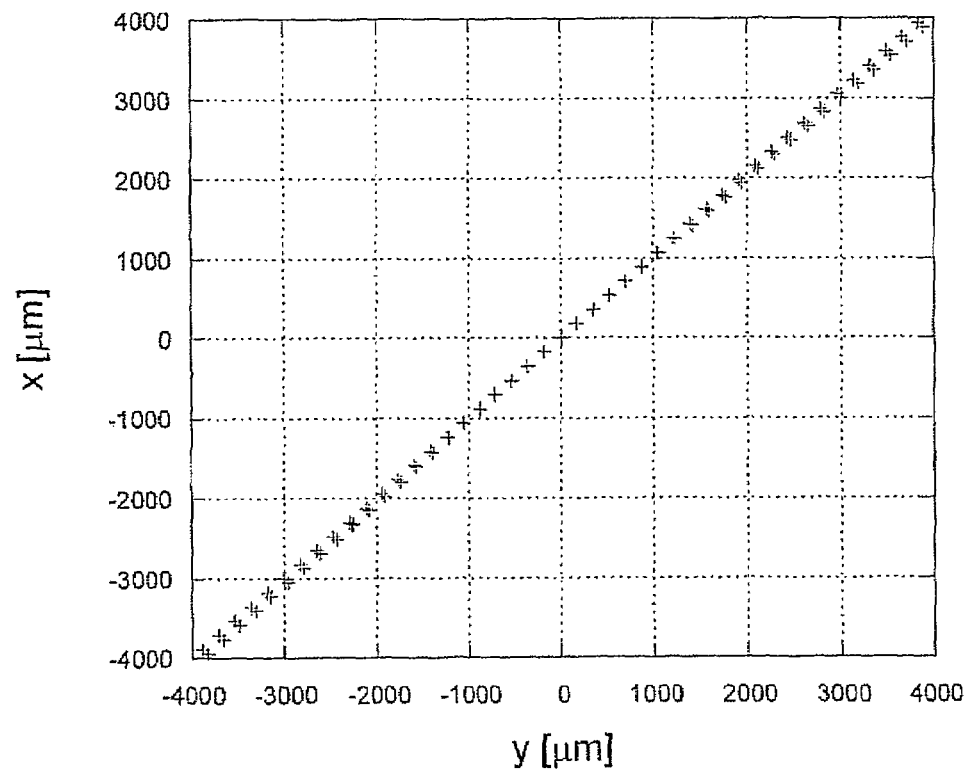
Figure 8B:
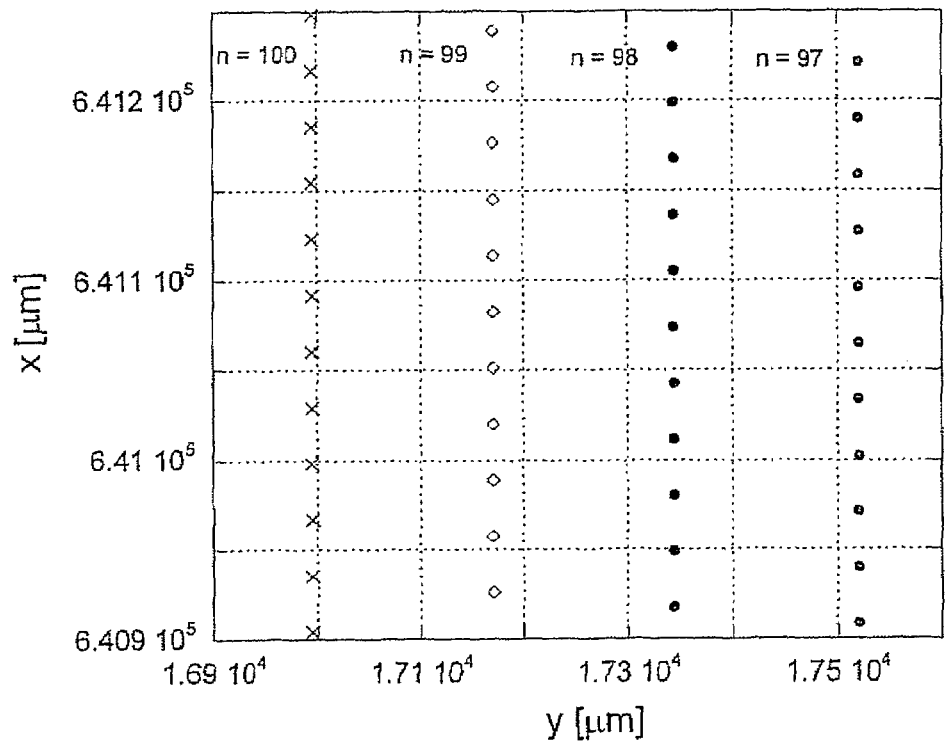

FIG. 8(A) shows the droplet positions for k=0 and k=K laid on top of each other showing change of y-pitch from 176 to 179 μm. FIG. 8(B) shows the droplet positions for the m=100-97 nozzles for subsequently printed droplets, showing that the distance between subsequent droplets varies by less than 1 μm as the rake angle is smoothly varied during the pass.

An important component of distortion compensation scheme is the efficient measurement and detection of the distortion either during a pre-patterning distortion mapping step, or in-flight during the patterning. It is not necessary to measure the distortion of any feature of the pattern, but only on the length scale over which the uncertainty in position due to distortion becomes larger than the required relative alignment and registration accuracy. In the following we describe a particular technique for the efficient measurement of the distortion pattern and the calculation of the print positions which can be used to compensate for the distortion.

The substrate is a regular arrayed pattern for an active area display back plane formed on the plastic substrate. It has 60×80 pixels with a resolution of 50 dpi, i.e. the pixel pitch is 500 μm. This nominal pattern is assumed to be dimensionally precise as it is defined by a pattern on a photomask which is transferred onto the substrate by photolithography.

Three alignment marks/rotation & calibration points at the corners of the pattern are used to calculate the sample rotation (with respect to the stages) and simple linear calibration factors in the X and Y axes, see FIG. 9. The calibration factors are calculated by inputting the known dimensions for these axes, taken from the photolithography mask dimensions and comparing these to the actual positions for the three corner points. The print direction is chosen to be the direction defined by the two alignment marks along the x-axis.

Once the panel is rotated and calibrated we move the positioning stages to designated locations (taken from the mask drawings) to view the location of the pattern. In this case we measure every $10^{th}$ feature along a particular direction. On a substrate with higher (smaller) distortions a larger (smaller) number of features is used. Using high magnification optics and graticule we measure the offset between expected pattern positions against actual positions, thus creating a map of tile distortion of the panel. Note that the data is not the absolute distortion of the substrate since it includes the initial calibration constants for the X and Y axes.

Samples containing arrayed source-drain patterns with pitches of 500 microns of 80-columns by 60-rows have been measured (hence known X=39,500 µm and known Y=29,500 µm).

Figure 10A:
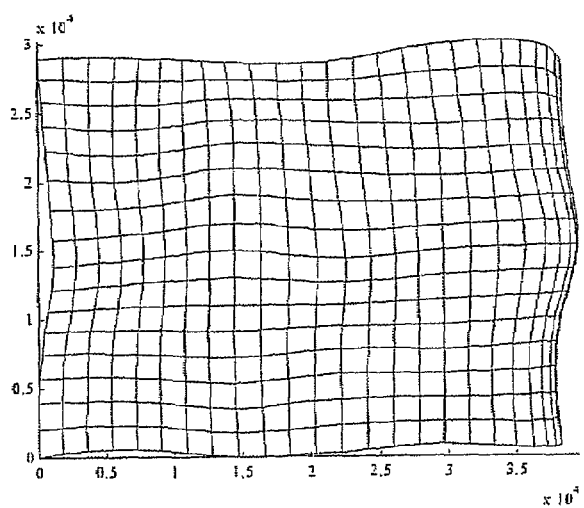
Figure 10B:
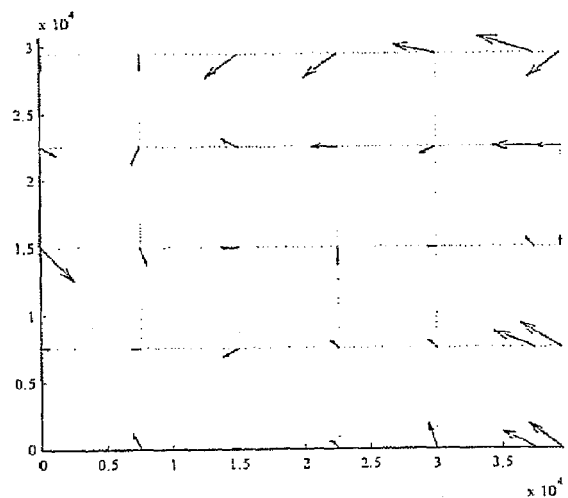
Figure 10C:
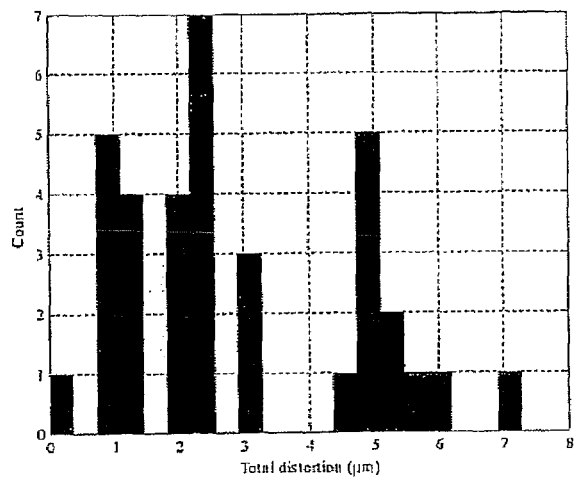

FIG. 10A shows a mesh plot of the X and Y positions of the patterns with the distortions magnified by a factor of 300. FIG. 10B shows this data in the form of a quiver plot. The arrows represent the magnitude and direction of the distortion of a particular pixel with respect to its nominal position. The length of each arrow is multiplied by a factor of 300. FIG. 10C is a histogram representation of the frequency of the absolute distortion. The plastic PET substrate exhibits maximum distortion of about 7 µm on a lengthscale of about 2". Examining FIG. 10B closely we note that the length of the arrows increase towards the top right corner of the patterned area, implying that there must be a linear distortion component present in the measurement.

The measurement data shown here for a PET substrate show clearly that the distortion of the substrate on the length scale of each individual printhead (2") is comparable to the droplet placement accuracy which can be achieved with a technique such as inkjet printing. This means that for typical process conditions on PET is not necessary to compensate for variations of $\Delta y(x_n, y_n)$ over the width of the printhead, at least as long as the substrate process temperature is kept below 150° C., and the substrate is heat-stabilized with the help of a pre-processing temperature anneal during which most of the substrate shrinkage can be made to occur before beginning the processing of the patterned layers.

Figure 11A:
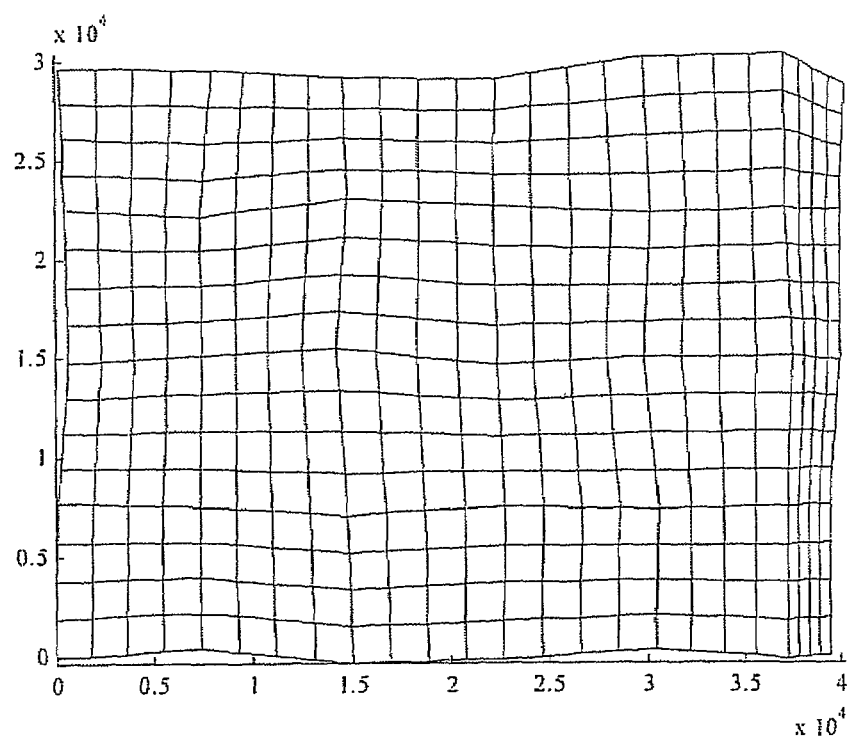
Figure 11B:
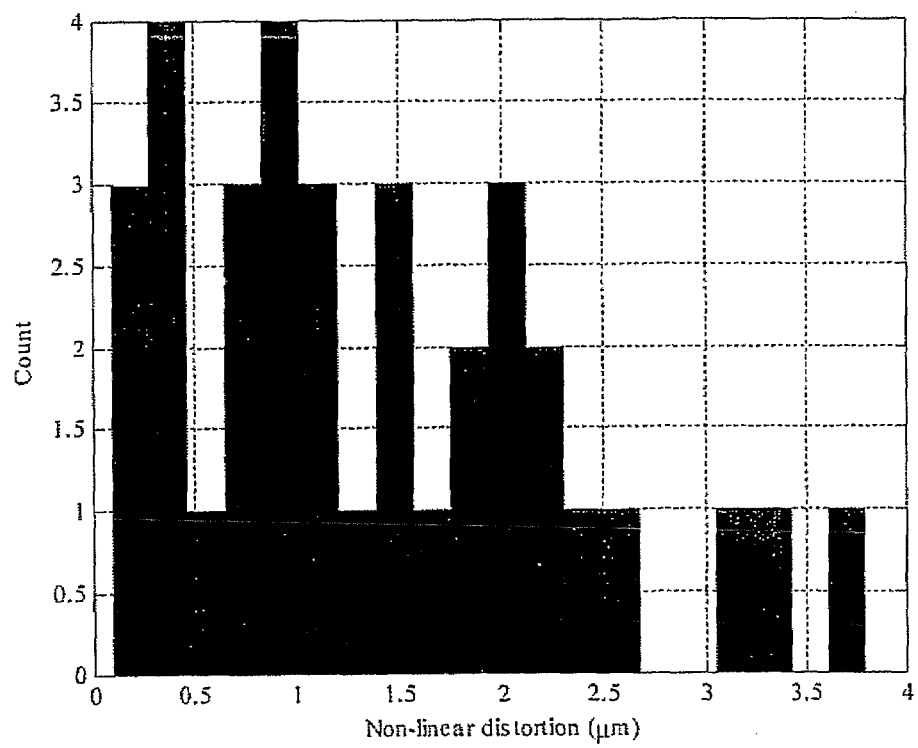

A simple example algorithm to determine the optimum y-position for the printed gate lines is to average the y-position of all measured pixels in each row along the print (x) direction, or over some distance along the x-direction over which the head rake angle is effectively kept constant. We illustrate this method here first for single nozzle printing. The gate lines are printed at a y-position that corresponds to the average y-position of pixels in a particular row. In this way the magnitude of the distortion can be reduced significantly. FIG. 11A shows a mesh plot for the distortion date adjusted for the average y-distortion in each row, and FIG. 11B shows the respective histogram. Note that the overall distortion values are now reduced to below 4 µm. This technique could be employed after mapping a substrate to create corrected electronic data files, to improve the resolution of the direct-write process on plastic substrates.

The method can be extended to multiple nozzle printing. For multiple nozzle printing the set of average y-positions of the pixels in each row averaged over a certain distance along the print direction are used to calculate the average pitch, rake angle of the printhead as well as the optimum y-position of the centre of the printhead as described above.

Figure 7B:
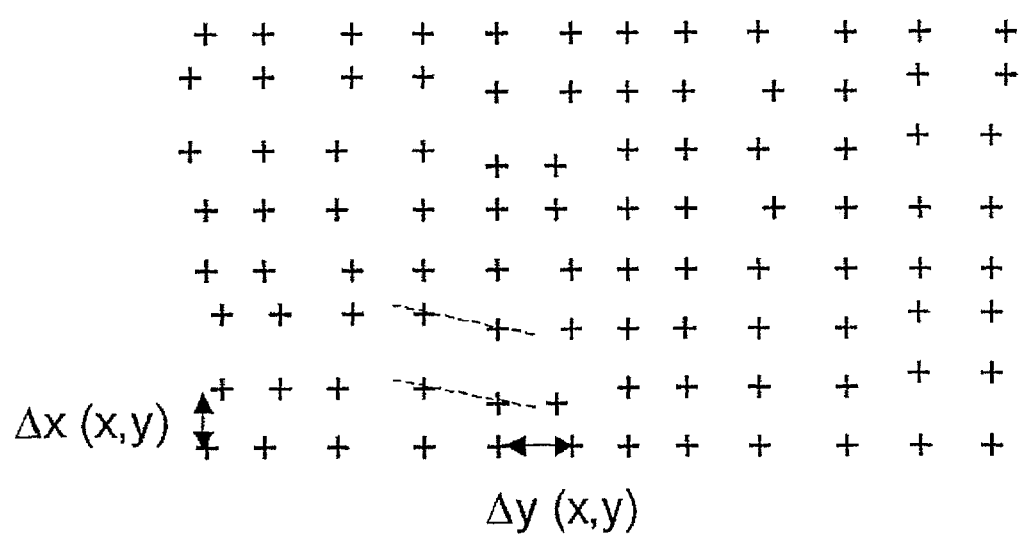

Distortions of the x-pitch both along the print direction as well as perpendicular to the print direction can be compensated for. This is used for the somewhat more complicated case where a two-dimensional periodic pattern needs to be printed that has a well defined pitch $\Delta y$ perpendicular to the print direction, but also a pitch $\Delta x$ along the print direction (FIG. 7(B)). Such a situation arises, for example, for the definition of the semiconducting active layer island of the TFT on an active matrix display. This pattern nominally consists of a rectangular or quadratic grid where semiconducting material needs to be deposited in the form of an active layer island on each node of the grid. Each island should be isolated from and not connected with neighbouring active layer islands/nodes. In this case the print direction can be chosen along one of the edges of the grid, defined to be the x-direction. As above the technique of adjusting rake angles and translation vectors for each printhead independently can be used to adjust to variations of the local y-pitch $\Delta y(x_n, y_n)$ in both the print direction as well as perpendicular to the print direction.

To compensate for the variations of the pitch $\Delta x(x_n, y_n)$ across the substrate several methods can be employed. One is to use a printhead each nozzle of which can receive an independent, arbitrary waveform trigger signal to fire droplets at any desired position. In this method rake angles and translation vectors for each printhead are adjusted to match the local y-pitch $\Delta y(x_n, y_n)$, and independent trigger waveforms are applied to each nozzle on each head to ensure that each droplet is fired at the right time to land in the correct location of the distorted pattern along the print direction. This method is capable for correcting for an arbitrary distortion $\Delta x(x_n, y_n)$. However, one disadvantage of this method that it requires a complex driver electronics, which can apply independent trigger signals to each nozzle. Also it puts some constraints on the design of the printhead itself, since in some designs where neighbouring nozzles share part of the actuator mechanism there is crosstalk between neighbouring nozzles, such that sometimes they cannot be fired at arbitrary time difference with respect to each other.

Figure 12A:
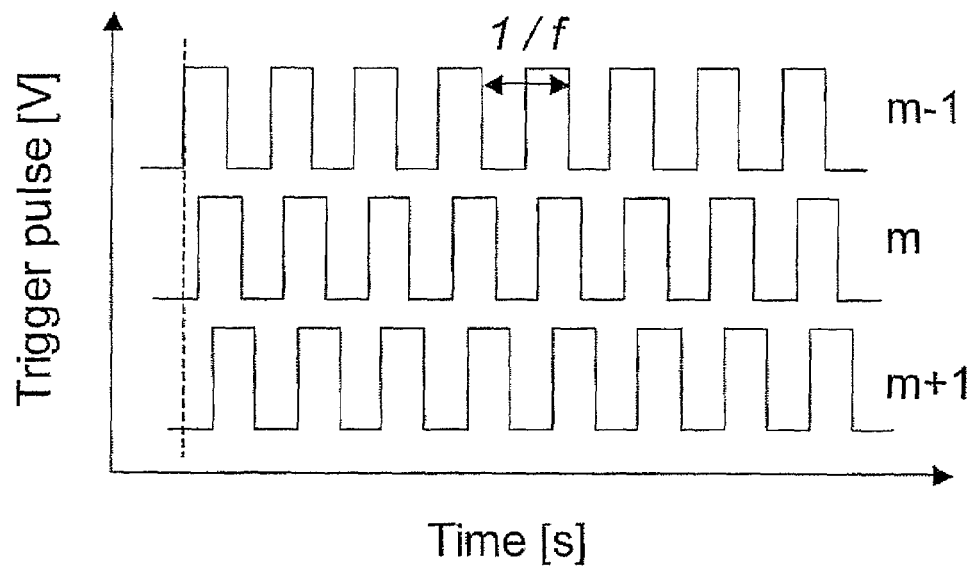
Figure 12B:
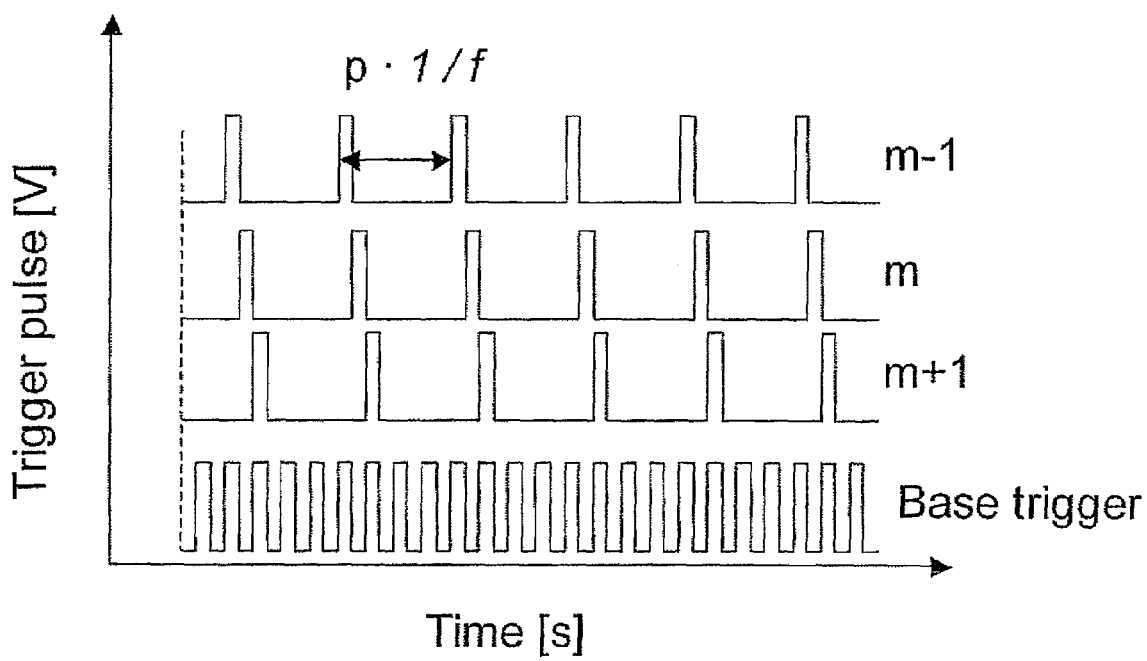

A simplified alternative scheme is to use the same firing frequency f for all nozzles oil a particular head, but to make the phase of the trigger signal to be independently adjustable for each nozzle during each swath (see FIG. 12A). The frequency f is adjusted such that $\Delta x(x_n, y_n) = v/f$, and needs to be variable during each swath to compensate for variations of $\Delta x(x_n, y_n)$ along x. For example, by changing the firing frequency from 32 kHz to 31 kHz the local distance $\Delta x$ between two neighbouring/subsequently fired droplets can be changed by 1 micron for a stage speed of 1 m/s (from 31.2 to 32.2 microns). Each printhead can have a different frequency to compensate for variations of $\Delta x(x,y)$ along y. The phase of the trigger signal applied to each nozzle is adjusted independently. This is to ensure that for a given rake angle of the head set to match the local $\Delta y(x_n, y_n)$ pitch each nozzle is fired at the correct time for the droplet to land in the correct position in the unit cell/pixel. Note that simultaneously fired droplets only land in the correct position for a number of discrete values of the rake angle. Since in the distortion scheme proposed here, the rake angle is varied to match the local y-pitch of the pattern, it is not possible to fire the droplets simultaneously if one wants to ensure that they land in the correct position of the unit cell/pixel.

Compared to using complete waveforms for each nozzle this method requires less complex driver electronics. It only requires a programmable phase shift circuit at the input to each nozzle, as well as a tunable frequency generator for the trigger signal of each printhead. The phase signal applied to each nozzle is determined on the basis of the distortion map which has been acquired either prior to the print step, or is being acquired in flight during the printing. The method of variable phase shift allows firing all nozzles at (preferably) the maximum frequency compatible with the mechanical design of the printhead, and therefore enables a high throughput.

A further alternative method for compensation of distortion of the x-pitch is to use a base trigger signal at a high frequency and a fixed phase common to all nozzles of a particular head, but fire each nozzle only at each p-th cycle of the base trigger signal (see FIG. 12B), such that $\Delta x(x_n,y_n) = p \cdot v/f$. Each nozzle can be fired at a different cycle of the base trigger signal to ensure the correct position of each droplet in the unit cell/pixel. In this method it is even possible to compensate for variations of $\Delta x(x_n,y_n)$ on the length scale of the printhead by choosing different values of p for the different nozzles of a printhead. To compensate for variation of $\Delta x(x_n, y_n)$ along the print direction either p or f can be varied. To compensate for longer scale variation of $\Delta x(x_n,y_n)$ perpendicular to the print direction it is desirable that p and/or f can be different for different printheads.

EXAMPLE 2

Laser-Ablation Based Distortion Compensation

With laser-based patterning it is also possible to perform the distortion compensation which is used to position the second conductive pattern locally within the tolerance band which is allowed by the alignment-tolerant design of the first conductive pattern on the substrate. Laser patterning can be used in different modes for definition of patterns by using, for example, laser ablation to remove material from the substrate in regions exposed to the laser irradiation, by locally transferring material from a sacrificial substrate onto the substrate, or by inducing photochemical changes in a layer on the substrate exposed to the laser irradiation, which can then be used for patterning. The laser irradiation pattern on the substrate can be defined either by scanning a focussed laser beam across the substrate, or by exposing part of the substrate through a photomask, and then scanning the substrate underneath the mask in a step-and-repeat mode. In the case of a focussed beam distortion compensation techniques similar to the one described above for multiple nozzle inkjet printing can be used for example. In the case of a step-and-repeat laser ablation process distortion compensation can be achieved by locally adjusting the lateral distance which the samples moves with respect to the mask between subsequent exposures.

According to one embodiment of the invention this can be achieved in the following way: The whole substrate pattern can be defined by moving the substrate in an essentially linear fashion along the x-direction, exposing areas along this line in a step-and-repeat manner, and subsequently stepping the substrate in the y-direction, and patterning another linear area along the x-direction in the same way. This process is continued until the whole area of the substrate is patterned. Distortion compensation can be implemented, for example, by measuring the position of two alignment mark features along each line in the x-direction, for example one in the first exposure area at the beginning of a line, and the other in the last exposure area at the end of a line in the x-direction. By measuring the distance between these alignment features in the x-direction the correct stepping distance between subsequent exposures along the x-direction can be determined without having to measure the exact position of each exposure area in the x-direction. In this way a linear distortion of the first conductive pattern can be compensated for by changing the size of the overlap region between subsequent exposures. If nonlinear distortions are significant and cannot be accommodated within the tolerance band of the alignment-tolerant design of the first conductive pattern more complex schemes using a larger number of distortion measurements can be employed. By measuring the position of the two features in the y-direction the correct center position for the exposure window in the y-direction can be determined.

The distortion compensation schemes that can be used with embodiments of the present invention are not limited to the foregoing examples. With both direct-write printing as well as other gate patterning techniques such as direct-write lithography, laser patterning or adaptive mask-based lithography and other distortion compensation schemes can be used.

The present invention is not limited to the foregoing examples. Aspects of the present invention include all novel and/or inventive aspects of the concepts described herein and all novel and/or inventive combinations of the features described herein. Embodiments of the invention might also be used in combination with conventional distortion compensation techniques, such as the technique described above of using a large number of heads to effectively create a grid much smaller than the nozzle pitch.

The applicant draws attention to the fact that the present inventions may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the inventions.

The invention claimed is:

1. A method of allowing for relative misalignment between different patterned layers when fabricating an electronic device on a flexible or distortable substrate, the method comprising:
    fabricating a first patterned layer on said substrate to define an operative region of said device using a pattern with a first linewidth; and
    fabricating a second patterned layer over said first patterned layer using, over said operative region, a second linewidth greater than said first linewidth,
    wherein the fabrication of said second patterned layer over said first patterned layer is a direct-write technique and is capable of compensating for distortions of the first patterned layer.

2. A method as claimed in claim 1 wherein the technique for patterning the second layer is capable of compensating for distortions of the first layer pattern of greater than the second linewidth.

3. A method as claimed in claim 2 wherein said technique for patterning the second layer capable of compensating for distortions of the first layer pattern comprises a laser patterning technique.

4. A method as claimed in claim 3, wherein said laser patterning technique comprises a step-and-repeat laser patterning technique.

5. A method as claimed in claim 4, wherein the distortion compensation comprises adjusting the lateral position of the laser exposure region for a portion of the second layer with respect to the respective portion of the first layer.

6. A method as claimed in claim 3, wherein said laser-patterning technique comprises laser ablation.

7. A method as claimed in claim 1, wherein said first patterned layer has at least one electrode defining said operative region and wherein said second patterned layer has an electrode entirely over said operative region.

8. A method as claimed in claim 1, wherein said fabricating includes fabricating a portion of said first patterned layer defining said operative region to include extension portions substantially symmetrically disposed to either side of a portion of said second patterned layer associated with said operative region.

9. A method of fabricating a transistor including the method of claim 1.

10. A method of fabricating a capacitor including the method of claim 1.

11. A method of fabricating an active matrix display including the method of claim 9.

12. A method of allowing for relative misalignment between different patterned layers when fabricating an electronic device on a flexible or distortable substrate, the method comprising:
- fabricating a first patterned layer on said substrate to define an operative region of said device using a pattern with a first linewidth; and
- fabricating a second patterned layer over said first patterned layer using, over said operative region, a second linewidth greater than said first linewidth,
- wherein fabricating said second patterned layer over said first patterned layer comprises inkjet printing as a direct-write technique.

13. A method of allowing for relative misalignment between different patterned layers when fabricating an electronic device on a flexible or distortable substrate, the method comprising:
- fabricating a first patterned layer on said substrate to define an operative region of said device using a pattern with a first linewidth; and
- fabricating a second patterned layer over said first patterned layer using, over said operative region, a second linewidth greater than said first linewidth,
- wherein fabrication of said second patterned layer over said first patterned layer is a distortion compensation technique comprising adjustment of a rake angle of a direct-write head during printing to compensate for the distortion of the first pattern.

14. A method of allowing for relative misalignment between different patterned layers when fabricating an electronic device on a flexible or distortable substrate, the method comprising:
- fabricating a first patterned layer on said substrate to define an operative region of said device using a pattern with a first linewidth; and
- fabricating a second patterned layer over said first patterned layer using, over said operative region, a second linewidth greater than said first linewidth,
- further comprising correcting for local distortions of said first patterned layer when fabricating said second patterned layer.

15. A method of allowing for relative misalignment between different patterned layers when fabricating an electronic device on a flexible or distortable substrate, the method comprising:
- fabricating a first patterned layer on said substrate to define an operative region of said device using a pattern with a first linewidth; and
- fabricating a second patterned layer over said first patterned layer using, over said operative region, a second linewidth greater than said first linewidth,
- further comprising configuring a pattern geometry of said second patterned layer such that, within a tolerance relative misalignment of said first and second patterned layers does not substantially alter operating characteristics of said device.

* * * * *